(12) United States Patent
Utsumi et al.

(10) Patent No.: US 6,469,946 B2
(45) Date of Patent: Oct. 22, 2002

(54) SEMICONDUCTOR MEMORY AND ITS TEST METHOD

(75) Inventors: Takashi Utsumi; Kiyoshi Adachi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/879,173

(22) Filed: Jun. 13, 2001

(65) Prior Publication Data

US 2002/0054526 A1 May 9, 2002

(30) Foreign Application Priority Data

Nov. 6, 2000 (JP) ......................................... 2000-337918

(51) Int. Cl.[7] ................................................. G11C 7/00
(52) U.S. Cl. ........................................ 365/201; 365/206
(58) Field of Search ................................ 365/201, 203, 365/206, 185.01, 207

(56) References Cited

U.S. PATENT DOCUMENTS 5,732,010 A * 3/1998 Takashima et al. ............ 365/63

FOREIGN PATENT DOCUMENTS

JP           A 4-328400        11/1992

* cited by examiner

Primary Examiner—Michael S. Lebentritt
Assistant Examiner—Anh Phung
(74) Attorney, Agent, or Firm—Burns, Doane, Swecker & Mathis, LLP (57) ABSTRACT

A semiconductor memory includes a test memory cell block and a test memory cell selector. The test memory cell block includes a plurality of memory cells that store bit values opposite to each other in adjacent memory cells. The test memory cell selector varies the potential of precharged bit lines by asserting one of the word lines of the test memory cell block, and selects as a memory cell to be tested, a memory cell that is connected to a bit line between the bit lines that changes their potentials in the test memory cell block. It can solve a problem of a conventional semiconductor memory in that it is very difficult to test the function of a circuit installed for suppressing the interference between adjacent bit lines.

13 Claims, 10 Drawing Sheets

SEMICONDUCTOR MEMORY AND ITS TEST METHOD

BACKGROUND OF THE INVENTION

1. Field of the Invention

The present invention relates to a semiconductor memory embedded in a single chip microcomputer, and particularly to a semiconductor memory and its test method including a test circuit for testing an inter-bit-line interference suppression function.

2. Description of Related Art

A semiconductor memory such as a mask ROM usually precharges its bit lines to place them at a middle potential before reading to accelerate its processing speed. Such a semiconductor memory, however, has a problem in that when it is mounted on a high-speed microcomputer, it often undergoes electrical interference from bit lines adjacent to a memory transistor from which the data is to be read, making it difficult to maintain its precharge potential, and to read correct data.

Figure 5:
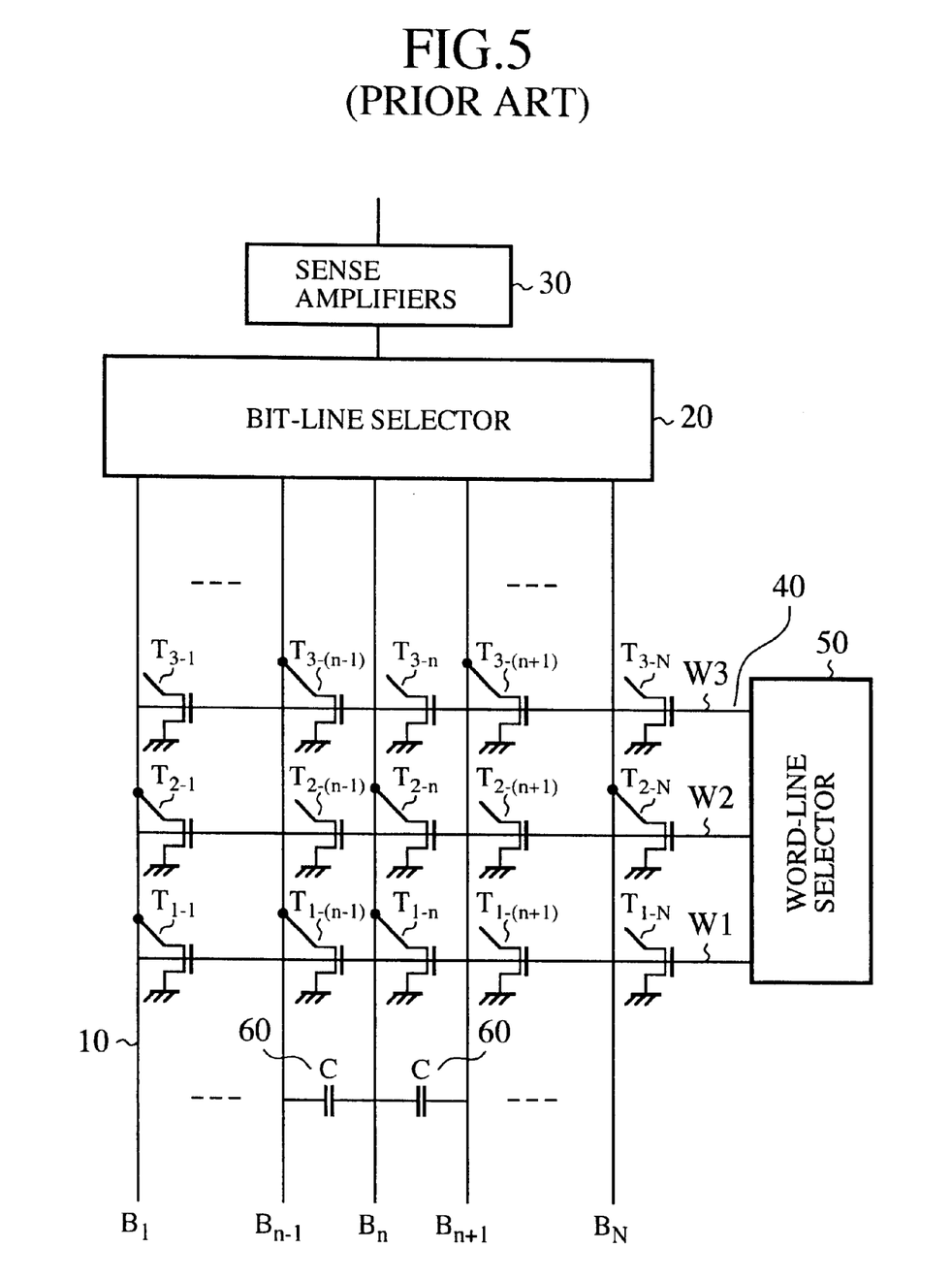
FIG. 5 is a circuit diagram showing a configuration of a conventional semiconductor memory (mask ROM)

FIG. 5 is a circuit diagram showing a configuration of a conventional semiconductor memory (mask ROM) that presents the foregoing problem involved in reading. In this figure, the reference numeral 10 designates bit lines for selecting a memory transistor. In the example of FIG. 5, bit lines $B_1, \ldots, B_{n-1}, B_n, B_{n+1}, \ldots, B_N$ are connected to a bit-line selector 20, where suffixes 1-N are positive integers. The reference numeral 20 designates the bit-line selector that decodes the address to selectively connect one of the bit lines 10 corresponding to the address with one of sense amplifiers 30. The reference numeral 30 designates the sense amplifiers for detecting and amplifying signals read from the memory transistors; and 40 designates word lines for selecting the memory transistors. In the example of FIG. 5, word lines W1, W2 and W3 are connected to a word-line selector 50 for decoding an address and for asserting one of the word lines 40 corresponding to the address; and each reference numeral 60 designates a wiring capacitance, a parasitic capacitance between adjacent bit lines 10 and 10. Finally, reference symbols $T_{1-1}$–$T_{1-N}$, $T_{2-1}$–$T_{2-N}$ and $T_{3-1}$–$T_{3-N}$ designate memory transistors placed at individual intersections of the bit lines 10 and the word lines 40.

Next, the operation of the conventional semiconductor memory will be described.

Figure 6:
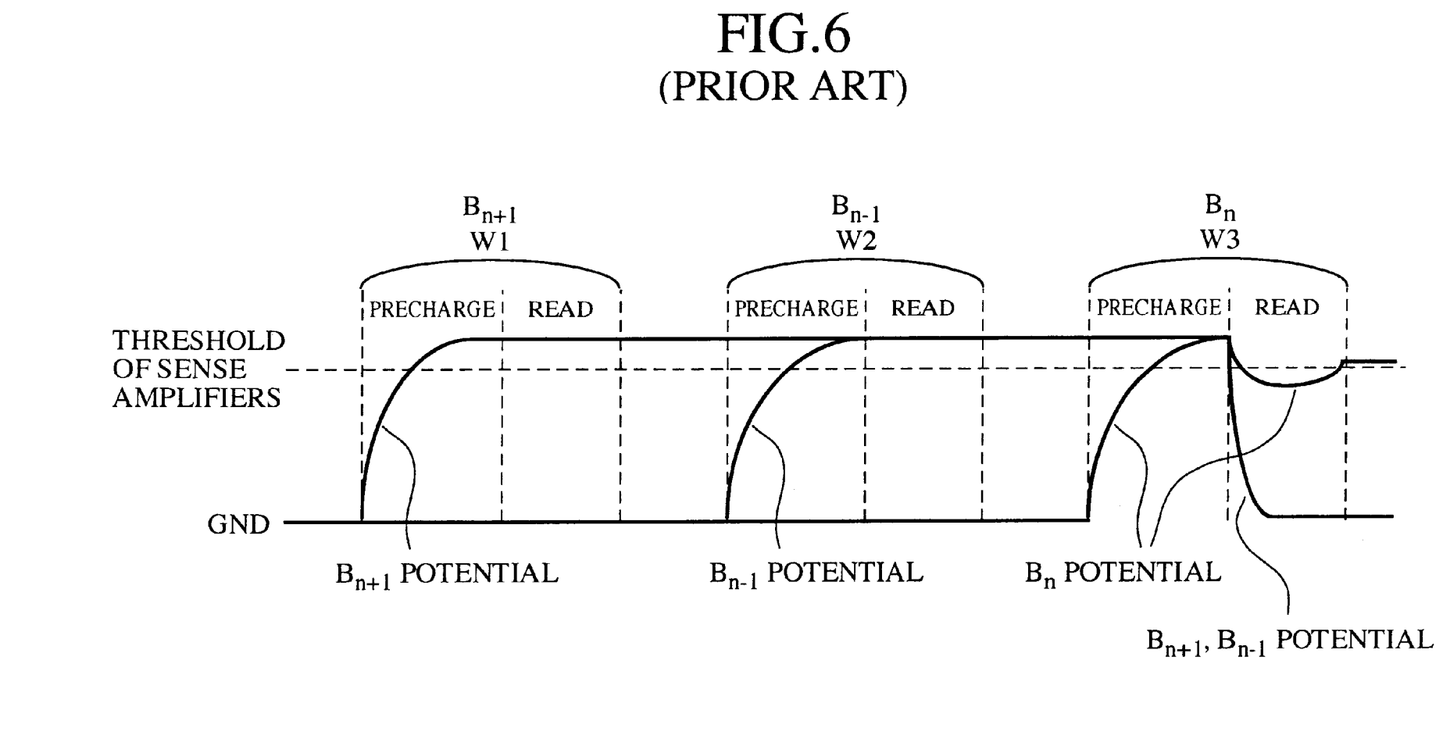
FIG. 6 is a timing chart illustrating the read operation of the semiconductor memory of FIG. 5.

FIG. 6 is a timing chart illustrating the read operation of the semiconductor memory of FIG. 5. Referring to FIG. 6, the problem involved in reading of the semiconductor memory will be described.

First, let us assume that according to an address signal input to the semiconductor memory, the data is read from the memory transistor $T_{1-(n+1)}$ at the intersection point of the bit line $B_{n+1}$ and the word line W1. In this case, the bit-line selector 20 selects the bit line $B_{n+1}$, and precharges its potential beyond the threshold value of the sense amplifiers 30. After completing the precharge, the potential of the bit line $B_{n+1}$ is supplied to the corresponding sense amplifier 30. If the potential is higher than the threshold value of the sense amplifier 30, a H (high) level value is read, and otherwise a L (low) level value is read. In this example, the memory transistor $T_{1-(n+1)}$ at the intersection point of the word line W1 and the bit line $B_{n+1}$ has its drain disconnected with the bit line, or its gate is always kept off according to the data content of the ROM. Accordingly, even if the word-line selector 50 asserts the word line W1, the potential of the bit line $B_{n+1}$ is maintained at the H level as illustrated in FIG. 6. In contrast, as for the memory transistor $T_{1-n}$ with its drain connected to the bit line, when the word-line selector 50 asserts the word line W1, its gate is turned on and the bit line is grounded, thereby outputting the L level.

Next, assume that according to the address signal input to the semiconductor memory, the data is read from the memory transistor $T_{2-(n-1)}$ at the intersection point of the bit line $B_{n-1}$ and the word line W2. In this case, the potential of the bit line $B_{n-1}$ is also maintained at the H level in the same manner as with the memory transistor $T_{1-(n+1)}$.

Finally, assume that according to the address signal input to the semiconductor memory, the data is read from the memory transistor $T_{3-n}$ at the intersection point of the bit line $B_n$ and the word line W3. Since the memory transistor $T_{3-n}$ is set at the H level, the potential of the bit line $B_n$ must be maintained at the H level, as well. In this case, however, the following problem arises.

The memory transistors $T_{3-(n1-)}$ and $T_{3-(n+1)}$ which are adjacent to the memory transistor $T_{3-n}$, and placed at the intersection point of the bit line $B_{n-1}$ and word line W3 and that of the bit line $B_{n+1}$ and word line W3, respectively, are set at the ON state as illustrated in FIG. 6. In other words, the two adjacent memory transistors $T_{3-(n-1)}$ and $T_{3-(n+1)}$ have their drains connected to the bit lines $B_{n-1}$ and $B_{n+1}$, or have their gates brought into the ON state when the word line W3 is asserted. In addition, the word line connected to their gates is also connected to the gate of the memory transistor $T_{3-n}$ which is to be read presently.

Therefore, when the word line W3 is asserted, that is, when a H level signal is supplied to the word line W3 to select the memory transistor $T_{3-n}$, the gates of the two adjacent memory transistors $T_{1-(n+1)}$ and $T_{2-(n-1)}$ are brought into the ON state, so that the H level potentials held on the bit lines $B_{n-1}$ and $B_{n+1}$ at the reading fall toward the ground potential.

Here, there are wiring capacitances or parasitic capacitances between the bit line $B_n$ and its adjacent bit lines $B_{n-1}$ and $B_{n+1}$. Therefore, the potential of the bit line $B_n$ which must keep its potential at the H level drops slightly because of the interference from the adjacent bit lines $B_{n-1}$ and $B_{n+1}$ whose potentials fall to the ground potential. If the potential of the bit line $B_n$ drops below the threshold value of the sense amplifiers 30 as illustrated in FIG. 6, the L level value is erroneously read instead of the correct H level value. Thus, the conventional semiconductor memory has a problem in that it likely to read the ROM data erroneously because of the interference from the adjacent bit lines.

To solve the problem due to the inter-bit-line interference, a method is know that connects resistors called a leaker to the bit lines.

Figure 7:
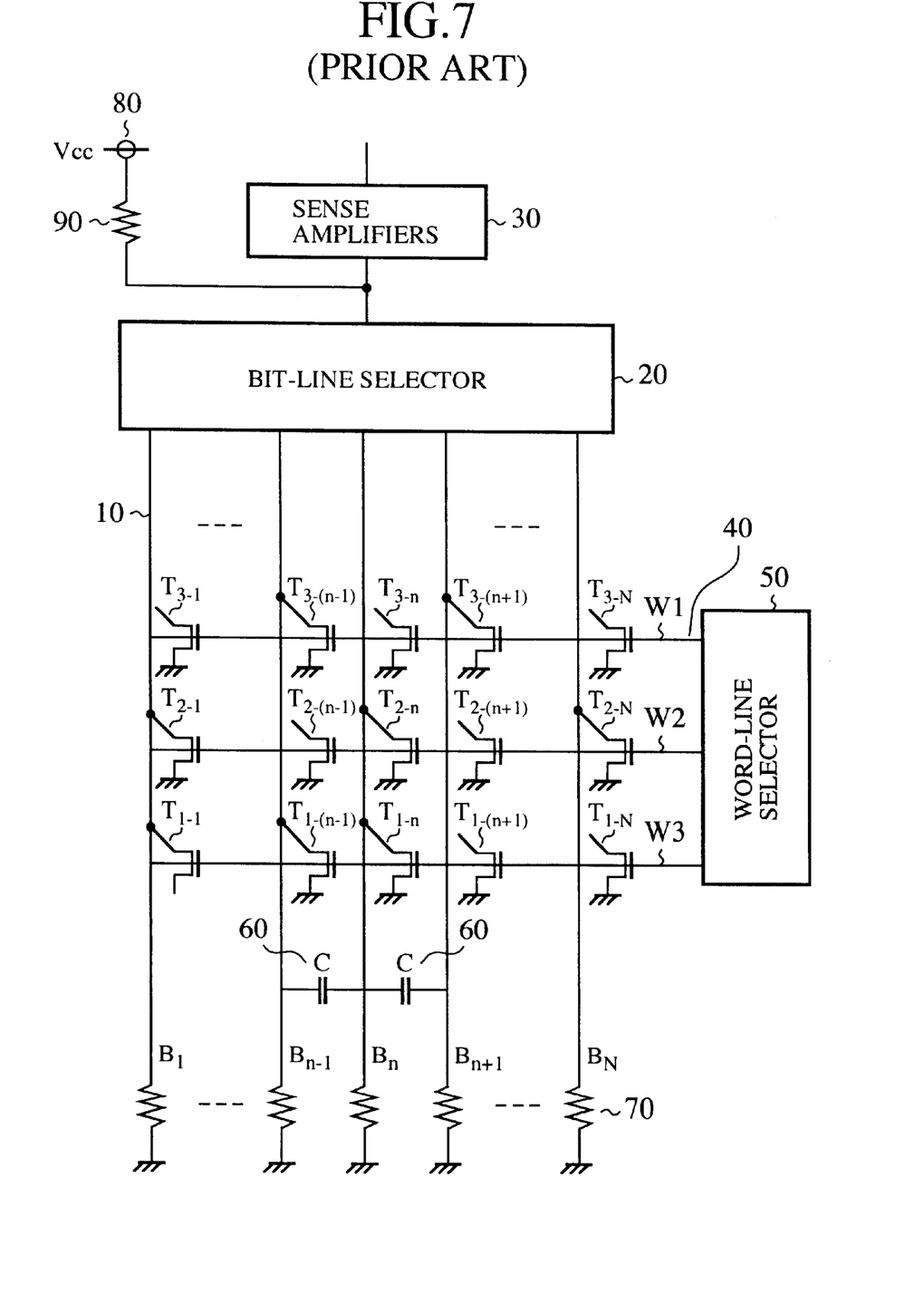
FIG. 7 is a circuit diagram showing a configuration of a mask ROM as a conventional semiconductor memory with a leaker.

FIG. 7 is a circuit diagram showing a configuration of a mask ROM as a conventional semiconductor memory with a leaker. In this figure, the reference numeral 70 designates resistors connected between the bit lines 10 and the ground potential as the leaker; 80 designates a power supply (Vcc) for precharging bit lines 10; and 90 designates a load resistor connected between the power supply 80 and the bit-line selector 20 to prevent the potential of the bit lines 10 from falling during reading the H level. Although the resistors 70 are used as the leaker in this example, ON transistors can be used instead. In addition, the driving power of the leaker is set less than that of the precharge circuit. In FIG. 7, the same reference numerals designate the same or like components to those of FIG. 5, and the description thereof is omitted here.

Next, the operation of the conventional semiconductor memory will be described.

Figure 8:
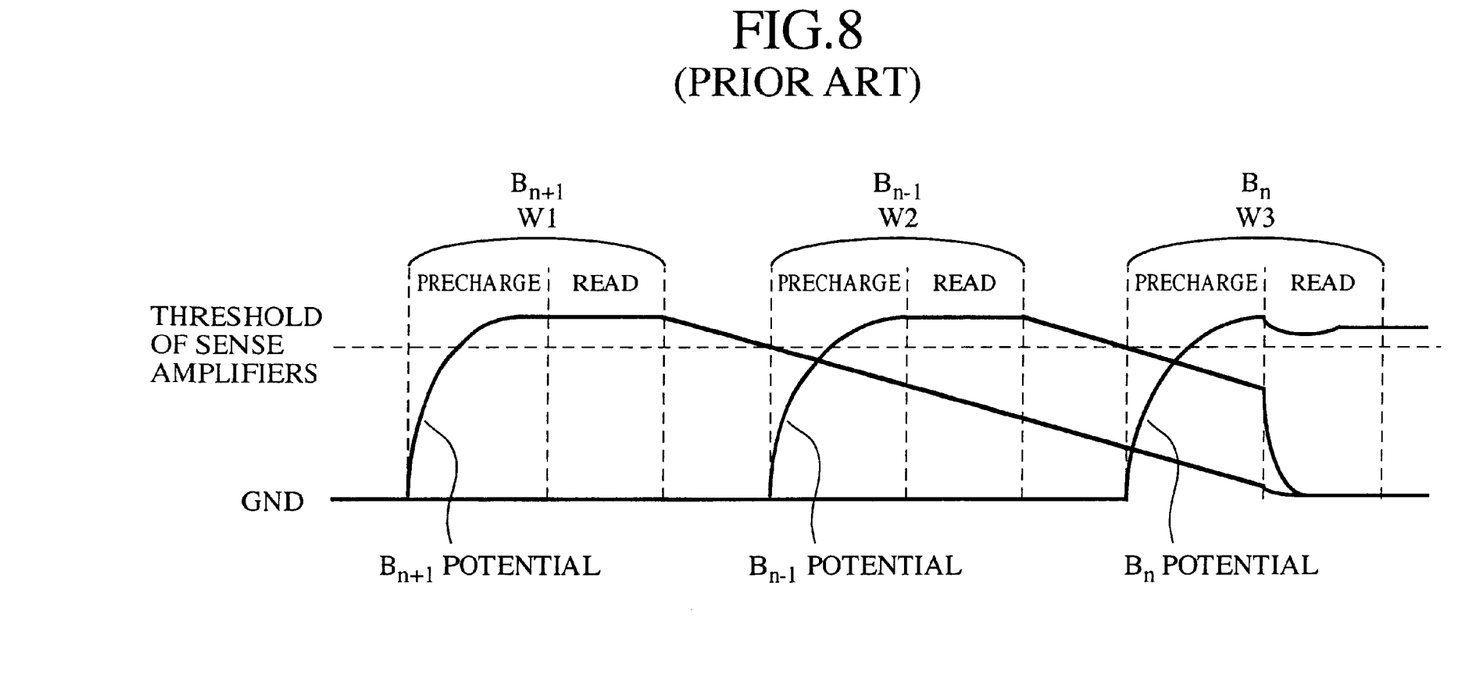
FIG. 8 is a timing chart illustrating the read operation of the semiconductor memory of FIG. 7.

FIG. 8 is a timing chart illustrating the read operation of the semiconductor memory of FIG. 7. The function of the leaker will be described with reference to FIG. 7.

First, just as in FIG. 5, according to the address signal input to the semiconductor memory, the data is read from the memory transistor $T_{1-(n+1)}$ placed at the intersection point of the bit line $B_{n+1}$ and the word line W1, and then from the memory transistor $T_{2-(n-1)}$ placed at the intersection point of the bit line $B_{n-1}$ and the word line W2.

Since the memory transistors $T_{1-(n+1)}$ and $T_{2-(n-1)}$ store the H level value, the bit lines $B_{n-1}$ and $B_{n+1}$ will maintain the H level potential at the precharge without the leaker.

Actually, however, in the semiconductor memory of FIG. 7, the potentials of the bit lines $B_{n-1}$ and $B_{n+1}$ gradually drop from the H level to the ground level before the data stored in the memory transistor $T_{3-n}$ is read, because of the resistors 70 connected to the bit lines $B_{n-1}$ and $B_{n+1}$ as the leaker.

When the word line W3 is asserted to select the memory transistor $T_{3-n}$ thereafter, both the potentials of the bit lines $B_{n-1}$ and $B_{n+1}$ have dropped to intermediate potentials between the H level and the ground level. Accordingly, as illustrated in FIG. 8, the interference from the adjacent bit lines is alleviated, preventing the potential of the bit line $B_n$ from falling below the threshold value of the sense amplifiers 30. As a result, the correct H level output value is obtained from the memory transistor $T_{3-n}$.

As another measure taken against the problem of the interference between the bit lines, a discharger can be connected to the bit lines.

Figure 9:
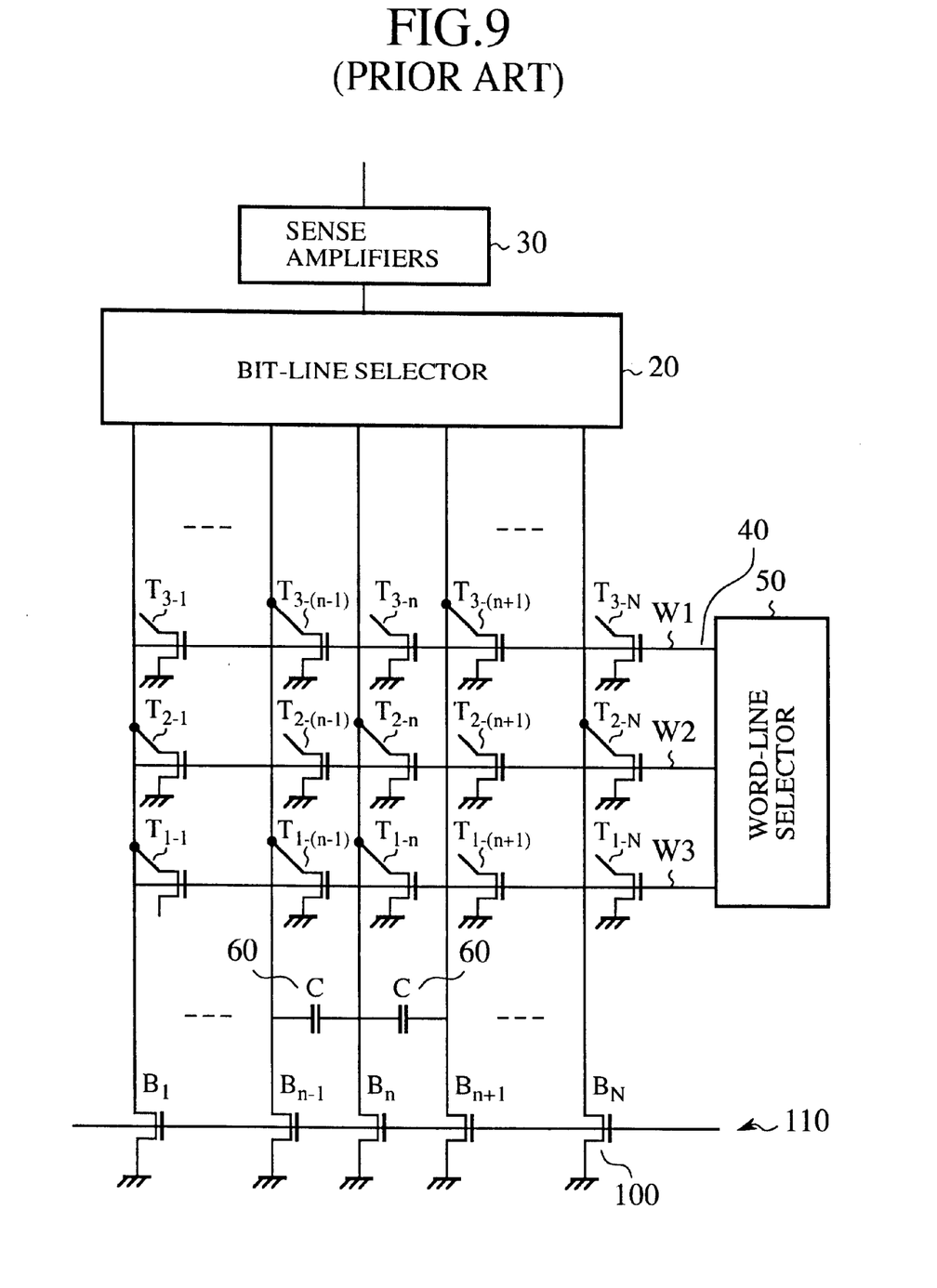
FIG. 9 is a circuit diagram showing a configuration of a mask ROM as a conventional semiconductor memory with a discharger.

FIG. 9 is a circuit diagram showing a configuration of a conventional mask ROM as a semiconductor memory with such a discharger. In this figure, the reference numeral 100 designates N-channel transistors connected between the bit lines 10 and the ground potential as the discharger; and 110 designates a discharge signal supplied to the gates of the N-channel transistors 100 as the discharger for asserting or deasserting them. In FIG. 9, the same reference numerals designate the same or like components to those of FIG. 5, and the description thereof is omitted here.

Next, the operation of the conventional semiconductor memory will be described.

Figure 10:
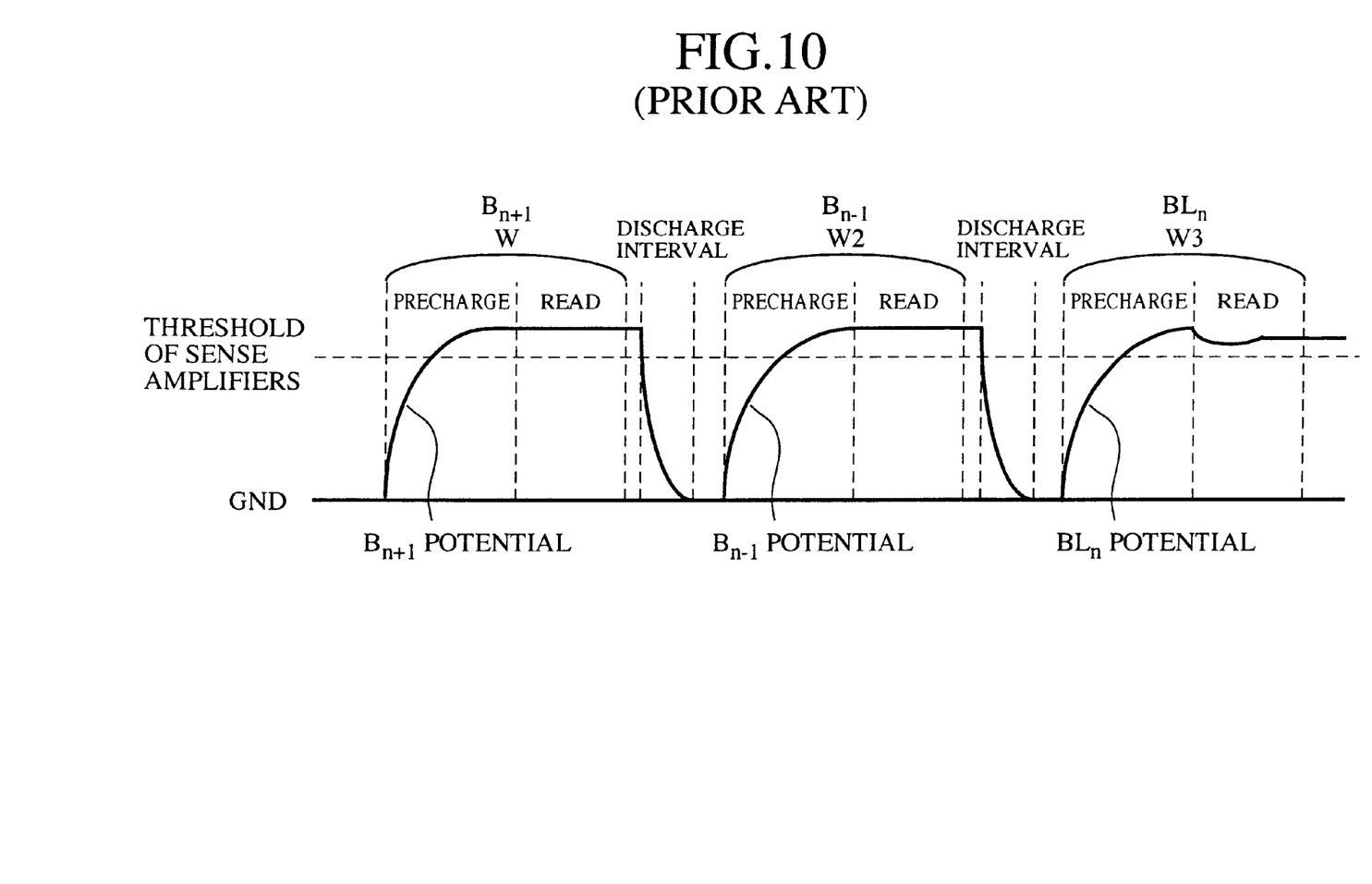
FIG. 10 is a timing chart illustrating the read operation of the semiconductor memory of FIG. 9.

FIG. 10 is a timing chart illustrating the read operation of the semiconductor memory of FIG. 9. The function of the discharger will be described with reference to FIG. 9.

First, just as in FIG. 5, according to the address signal input to the semiconductor memory, the data is read from the memory transistor $T_{1-(n+1)}$ placed at the intersection point of the bit line $B_{n+1}$ and the word line W1, and then from the memory transistor $T_{2-(n-1)}$ placed at the intersection point of the bit line $B_{n-1}$ and the word line W2.

Since the memory transistors $T_{1-(n+1)}$ and $T_{2-(n-1)}$ store the H level value, the bit lines $B_{n-1}$ and $B_{n+1}$ will maintain the H level potential at the precharge without the discharger.

Actually, however, in the semiconductor memory of FIG. 9, the potentials of the bit lines $B_{n-1}$ and $B_{n+1}$ are dropped from the H level to the ground level before the data stored in the memory transistor $T_{3-n}$ is read, because of the H level discharge signal 110 supplied to the N-channel transistors 100.

When the word line W3 is asserted to select the memory transistor $T_{3-n}$ thereafter, both the potentials of the bit lines $B_{n-1}$ and $B_{n+1}$ have already dropped to the ground level. Accordingly, as illustrated in FIG. 10, the interference between the adjacent bit lines is alleviated, thereby preventing the potential of the bit line $B_n$ from falling below the threshold value of the sense amplifiers 30. As a result, a correct H level output value is obtained from the memory transistor $T_{3-n}$.

Thus, the conventional semiconductor memories install the circuits for alleviating the interference between the bit lines to prevent the erroneous read from taking place.

As for the semiconductor memories, a test is implemented to check whether it can write or read data correctly. The test of the semiconductor memory is usually carried out for each address, that is, for each memory transistor using a test pattern in accordance with the data stored in the individual memory transistors.

With the foregoing configurations, the conventional semiconductor memories have a problem in that it is very difficult for them to test the function of the circuits installed for suppressing the interference between the adjacent bit lines.

The problem will be described more specifically. To test the function of the circuit installed to suppress the interference between the adjacent bit lines, it is necessary to design the test pattern by analyzing the freely stored data in the semiconductor memory to search for such an address sequence of the memory transistors as bringing about the inter-bit-line interference. Thus, the pattern for generating the inter-bit-line interference differs for each semiconductor memory.

Therefore, to test the function of the circuit installed for suppressing the interference between the adjacent bit lines, test patterns for the inter-bit-line interference must be designed for each semiconductor memory before testing the product, which is a very time-consuming work.

SUMMARY OF THE INVENTION

The present invention is implemented to solve the foregoing problem. It is therefore an object of the present invention to provide a semiconductor memory and its test method capable of facilitating estimation and test on the function of the circuit for suppressing the interference between the bit lines independently of the stored data by installing an inter-bit-line interference test circuit.

According to a first aspect of the present invention, there is provided a semiconductor memory comprising: a memory cell block including a plurality of memory cells placed at individual intersection points of a plurality of word lines and a plurality of bit lines that are arranged in a matrix fashion; an inter-bit-line interference suppression circuit connected to the plurality of bit lines, for releasing potentials of bit lines adjacent to a memory cell whose data is to be read among the memory cells of the memory cell block, thereby suppressing electrical interference between the bit lines; means for precharging, before reading data stored in a memory cell to be tested, at least bit lines adjacent to a bit line corresponding to the memory cell to be tested among the plurality of bit lines;

test memory cell selector for asserting a word line of the memory cell to be tested that is connected to a bit line between the bit lines precharged by the means for precharging; and a decision circuit for deciding as to whether the inter-bit-line interference suppression circuit operates normally or not in response to the data stored in the memory cell to be tested or to potential changes of the bit lines precharged.

Here, the semiconductor memory may further comprise a test memory cell block including a plurality of memory cells placed at individual intersection points of the plurality of bit lines and at least two word lines that are arranged in a matrix fashion, in which the memory cells adjacent to each other store bit values opposite to each other, wherein the means for precharging may consist of a bit line selector, and the test memory cell selector may produce the potential changes of the precharged bit lines by asserting one of the word lines of the test memory cell block, and select a memory cell that is connected to a bit line between the bit lines with their potentials changed from the test memory cell block as the memory cell to be tested.

The means for precharging may consist of a precharge circuit for precharging all the bit lines simultaneously, and the test memory cell selector may select a memory cell that is connected to a bit line between the bit lines precharged by the precharge circuit from the memory cell block as the memory cell to be tested.

The semiconductor memory may further comprise a test memory cell block including a plurality of memory cells placed at individual intersection points of the plurality of bit lines and at least two word lines that are arranged in a matrix fashion, in which the memory cells adjacent to each other store bit values opposite to each other, wherein the means for precharging may consist of a precharge circuit for precharging all the bit lines simultaneously, and the test memory cell selector may produce the potential changes of the precharged bit lines by asserting one of the word lines of the test memory cell block, and select a memory cell that is connected to a bit line between the bit lines with their potentials changed from the test memory cell block as the memory cell to be tested.

At least one of a gate width and a gate length of the memory cells of the test memory cell block may be greater than those of the memory cells constituting the memory cell block.

The test memory cell selector may assert the word line of the test memory cell block by a potential higher than a potential used in an actual operation.

The means for precharging may precharge the bit lines up to a potential higher than a potential used in an actual operation.

The test memory cell selector may assert the word line of the memory cell block by a potential higher than a potential used in an actual operation.

The semiconductor memory may further comprise source potential modifying means for bringing a source potential of the transistors constituting the memory cells to a potential equal to or less than a ground level.

According to a second aspect of the present invention, there is provided a test method of a semiconductor memory including a memory cell block having a plurality of memory cells placed at individual intersection points of a plurality of word lines and a plurality of bit lines that are arranged in a matrix fashion, and an inter-bit-line interference suppression circuit connected to the plurality of bit lines, for releasing potentials of bit lines adjacent to a memory cell whose data is to be read among the memory cells of the memory cell block, thereby suppressing electrical interference between the bit lines, the test method of a semiconductor memory comprising the steps of: precharging at least bit lines adjacent to a bit line corresponding to a memory cell to be tested among the plurality of bit lines; asserting a word line of the memory cell to be tested that is connected to a bit line between the bit lines precharged; and deciding, in response to the data stored in the memory cell to be tested or to potential changes of the bit lines precharged, as to whether a suppression function of the inter-bit-line interference suppression circuit operates normally or not against electrical interference from the bit lines adjacent to the memory cell to be tested.

Here, the semiconductor memory may further comprise a test memory cell block including a plurality of memory cells placed at individual intersection points of the plurality of bit lines and at least two word lines that are arranged in a matrix fashion, in which the memory cells adjacent to each other store bit values opposite to each other, wherein the step of asserting may produce the potential changes of the precharged bit lines by asserting one of the word lines of the test memory cell block, and select a memory cell connected to a bit line between the bit lines with their potentials changed from the test memory cell block as the memory cell to be tested.

The step of precharging may precharge all the bit lines simultaneously, and the step of asserting may select a memory cell that is connected to a bit line between the precharged bit lines from the memory cell block as the memory cell to be tested.

The semiconductor memory may further comprise a test memory cell block including a plurality of memory cells placed at individual intersection points of the plurality of bit lines and at least two word lines that are arranged in a matrix fashion, in which the memory cells adjacent to each other store bit values opposite to each other, wherein the step of precharging may precharge all the bit lines simultaneously, and the step of asserting may produce the potential changes of the precharged bit lines by asserting one of the word lines of the test memory cell block, and select a memory cell connected to a bit line between the bit lines with their potentials changed from the test memory cell block as the memory cell to be tested.

DETAILED DESCRIPTION OF THE PREFERRED EMBODIMENTS

The invention will now be described with reference to the accompanying drawings.

Embodiment 1

Figure 1:
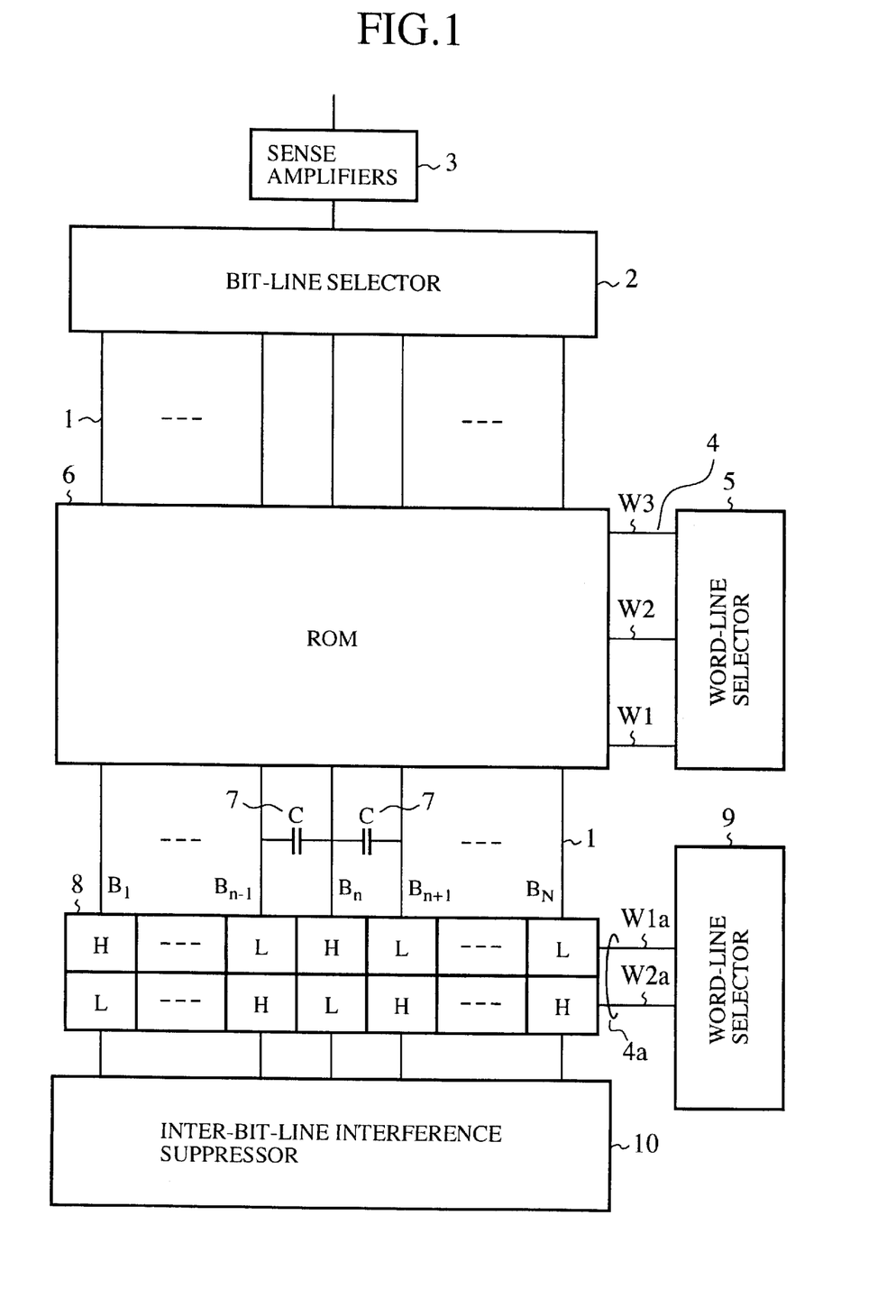
FIG. 1 is a block diagram showing a configuration of an embodiment 1 of the semiconductor memory in accordance with the present invention.

FIG. 1 is a block diagram showing a configuration of an embodiment 1 of the semiconductor memory in accordance with the present invention. In this figure, the reference numeral 1 designates bit lines for selecting a memory transistor (memory cell; not shown) in a ROM 6 or test ROM 8. In the example of FIG. 1, bit lines $B_1, \ldots, B_{n-1}, B_n, B_{n+1}, \ldots, B_N$ are connected to a bit-line selector 2, where suffixes 1-N are positive integers. The reference numeral 2 designates the bit-line selector that decodes the address to selectively connect one of the bit lines 10 corresponding to the address with one of sense amplifiers 3. The reference numeral 3 designates the sense amplifiers for detecting and amplifying signals read from the memory transistors; and 4 designates word lines for selecting the memory transistors. In the example of FIG. 1, word lines W1, W2 and W3 are connected to a word-line selector 5. The reference numeral 4a designates word lines for selecting some of the memory transistors in the test ROM 8. In the example of FIG. 1, word lines W1a and W2a are connected to a word-line selector 9. The reference numeral 5 designates the word-line selector for decoding the address and for asserting one of the word lines 4 corresponding to the address; 6 designates the ROM (memory cell block) including a plurality of memory transistors (N-channel MOS transistors, for example) placed at intersection points of the bit lines 1, . . . , 1 and the word lines 4 which intersect perpendicularly in a matrix fashion; and 7 designates a wiring capacitance between adjacent bit lines 1 and 1.

The reference numeral 8 designates a test ROM (test memory cell block) including a plurality of memory transistors placed at intersection points of the bit lines 1, . . . , 1 and the two word lines 4a which intersect perpendicularly in a matrix fashion, in which adjacent memory transistors store bit values opposite to each other. More specifically, the first row of the test ROM 8 defined by the word line W1a stores bit information consisting of the H level (bit value 1) and L level (bit value 0) in the order of H, L, H, L, . . . , and the second row defined by the word line W2a stores the bit information in the order of L, H, L, H, . . . . The dimension of the test ROM 8 is two word lines in column and the same as the ROM 6 in row. The reference numeral 9 designates a word-line selector for decoding an address specified by a test program and for asserting one of the word lines 4a corresponding to the address, when testing the function of an inter-bit-line interference suppressor 10 for suppressing the interference between the bit lines 1 and 1; and 10 designates the inter-bit-line interference suppressor connected between the bit lines 1 and the ground potential. The inter-bit-line interference suppressor 10 releases the potential of the bit lines 1 and 1 adjacent to the memory transistor from which the stored data of the test ROM 8 is to be read, thereby preventing the data stored in the memory cell from being erroneously read because of the interference between the bit lines 1 and 1. As the inter-bit-line interference suppressor 10, the foregoing leaker or discharger can be used.

Next, the operation of the present embodiment 1 will be described.

Since the present invention relates to a semiconductor memory capable of facilitating estimation and test on the function of the inter-bit-line interference suppressor 10 for suppressing the interference between the bit lines 1 and 1, the test operation will be described here.

To test the function of the circuit installed for suppressing the interference between the adjacent bit lines in the conventional semiconductor memory, it is necessary to search for the address sequence of the memory transistors, which causes inter-bit-line interference by analyzing the freely stored data in the ROM to produce the test pattern. Furthermore, since the pattern for generating the inter-bit-line interference differ for respective semiconductor memory with different stored data, it is necessary to fabricate a test pattern for the inter-bit-line interference for each semiconductor memory for the test of the product.

In contrast with this, the present embodiment 1 of the semiconductor memory can easily estimate and test the function of the inter-bit-line interference suppressor 10 independently of the data stored in the ROM 6 by installing the test ROM 8 as the inter-bit-line interference test circuit.

First, when the test program is input to the microcomputer embedding the embodiment 1 of the semiconductor memory, the bit-line selector 2 precharges the bit lines 1 and 1 adjacent to the bit line 1 connected to the memory transistor to be tested, thereby bringing them into the high potential state. For example, the stored data are sequentially read in the following order: first, from the memory transistor placed at the intersection point of the bit line $B_{n-1}$ and the word line W2a; second from the memory transistor placed at the intersection point of the bit line $B_{n+1}$ and the word line W2a; and finally from the memory transistor placed at the intersection point of the bit line $B_n$ and the word line W1a.

To read the data stored in the memory transistor placed at the intersection point of the bit line $B_n$ and the word line W2a, the bit-line selector 2 selects the bit line $B_{n-1}$, and precharges it to a potential higher than the threshold value of the sense amplifiers 3. Since the data of the memory transistor is preset at the H level (bit value 1), the memory transistor at the intersection point of the word line W2a and the bit line $B_{n-1}$ has its drain disconnected with the bit line $B_{n-1}$, that is, its gate is always placed at the OFF state. Accordingly, the high potential of the bit line $B_{n-1}$ is supplied to the corresponding one of the sense amplifiers 3 so that the H-level value higher than the threshold value of the sense amplifiers 3 is read as the data stored in the memory transistor.

In this case, if the inter-bit-line interference suppressor 10 connected to the bit line $B_{n-1}$ is inactive, the potential of the bit line $B_{n-1}$ continues the H-level value until the word-line selector 9 selects the word line W2a next. In contrast with this, when the inter-bit-line interference suppressor 10 connected to the bit line $B_{n-1}$ is active, the potential of the bit line $B_{n-1}$ drops from the H level to a value near the ground level because of the operation as described in connection with the conventional technique.

Subsequently, to read the data stored in the memory transistor placed at the intersection point of the bit line $B_{n+1}$ and the word line W2a, the bit-line selector 2 selects the bit line $B_{n+1}$, and precharges it to a potential higher than the threshold value of the sense amplifiers 3. Since the memory transistor is also preset at the H level, if the inter-bit-line interference suppressor 10 connected to the bit line $B_{n+1}$ is inactive, the potential of the bit line $B_{n+1}$ continues the H-level value even if the word-line selector 9 asserts the word line W2a. In contrast with this, when the inter-bit-line interference suppressor 10 connected to the bit line $B_{n+1}$ is active, the potential of the bit line $B_{n+1}$ drops from the H level to a value near the ground level because of the operation as described in connection with the conventional technique.

The operation up to this stage corresponds to the precharge step.

Afterward, the memory transistor placed at the intersection point of the bit line $B_n$ and the word line W1a is selected as the memory transistor to be tested. More specifically, the bit-line selector 2 precharges the bit line $B_n$ to the potential higher than the threshold value of the sense amplifiers 3, and the word-line selector 9 asserts the word line W1a by supplying it with the H level signal.

Thus, the potential of the bit line $B_n$ is supplied to the corresponding one of the sense amplifiers 3 as the data stored in the memory transistor placed at the intersection point of the bit line $B_n$ and the word line W1a. The output signal from the sense amplifier 3 is the test data about the function of the inter-bit-line interference suppressor 10 for the bit line $B_n$. A decision is made from the test data as to whether the inter-bit-line interference suppressor 10 operates normally or not.

More specifically, the memory transistor placed at the intersection point of the bit line $B_n$ and the word line W1a stores the H-level value as its data, and is adjacent to the bit lines $B_{n-1}$ and $B_{n+1}$ which are precharged to the H level as described above.

Accordingly, if the inter-bit-line interference suppressor 10 does not operate normally after the precharge step, and when the word line W1a is asserted by the H-level signal to select the memory transistor, the electrical interference will take place between the bit lines 1 and 1 because of the potential changes involved in the drop of the H-level potentials held in the bit lines $B_{n-1}$ and $B_{n+1}$ to the ground potential. It will drop the potential of the memory transistor to some extent, which must keep the H level. If the potential drops below the threshold value of the sense amplifiers 3, it will bring about the L level test data.

In contrast, when the inter-bit-line interference suppressor 10 continues operating normally until after the precharge step, the H-level potentials held in the adjacent bit lines $B_{n-1}$ and $B_{n+1}$ have already fallen to the ground potential. Accordingly, when reading the data stored in the memory transistor placed at the intersection point of the bit line $B_n$ and the word line W1a, the interference between the adjacent bit lines is alleviated, so that the potential of the bit line $B_n$ does not fall below the threshold value of the sense amplifiers 3, resulting in the correct H-level test data.

Thus, by sequentially reading the data stored in the memory transistors to be tested in the test ROM 8 after precharging the bit lines 1 and 1 adjacent to the memory transistors to the high potential state, the function of the inter-bit-line interference suppressor 10 can be tested for all the bit lines 1, . . . , 1 under the condition that the inter-bit-line interference can take place. In addition, the pattern that can generate the inter-bit-line interference during the test can be uniquely determined by the data stored in the test ROM 8, regardless of the data stored in the ROM 6.

The function of the inter-bit-line interference suppressor 10 can also be tested by monitoring potential changes of the bit lines 1 and 1 adjacent to the memory transistor to be tested. More specifically, the operation of the inter-bit-line interference suppressor 10 can be confirmed by testing whether the bit lines 1 and 1 adjacent to the memory transistor to be tested exhibit the potential drop as illustrated in FIGS. 8 and 10.

As described above, the present embodiment 1 is configured such that it comprises the test ROM 8 which has the same width as the ROM 6 (the same number of bit lines 1) and the height of two bits, and prestores bit values opposite to each other in its adjacent memory transistors, that it selects as the memory transistor to be tested the memory transistor which is placed between the bit lines 1 and 1 in the high potential state because of charges supplied thereto, and undergoes electrical interference produced by the potential change of the high potential bit lines 1 and 1 during reading the data stored in the transistor to be tested, and that it tests whether the suppression function of the inter-bit-line interference suppressor 10 operates normally or not against the electrical interference from the bit lines 1 and 1 adjacent to the memory transistor to be tested. Thus employing the test ROM 8 that has a height greater than two and stores the bit values opposite to each other in the adjacent memory transistors, the present embodiment 1 can easily determine the pattern generated by the interference between the bit lines 1 and 1 regardless of the data stored in the ROM 6. As a result, it can facilitate the estimation and test on the function of the inter-bit-line interference suppressor 10 even for the semiconductor memories with different stored data.

Incidentally, in the present embodiment 1, the bit-line selector 2 can precharge the bit lines 1 and 1 up to a potential higher than the potential in actual operation. Thus, it can increase the potential changes of the bit lines 1 and 1 adjacent to the memory transistor to be tested, thereby facilitating producing the interference between the bit lines 1 and 1 than in the actual operation. As a result, more rigorous estimation and test are conducted on the function of the inter-bit-line interference suppressor 10 than in actual operating condition, thereby improving the reliability of the function of the inter-bit-line interference suppressor 10.

Furthermore, in the present embodiment 1, the test ROM 8 can be composed of transistors with a gate width (W) wider than or a gate length (L) longer than that of the memory transistors of the ROM 6. This can increase their drain-source current, which in turn can accelerate the potential changes of the adjacent bit lines in the high potential state, and produce the interference between the bit lines 1 and 1 in the test ROM 8 more easily than in the actually used ROM 6. As a result, more rigorous estimation and test can be achieved on the function of the inter-bit-line interference suppressor 10 than in actual operating condition, thereby improving the reliability of the function of the inter-bit-line interference suppressor 10.

Embodiment 2

Figure 2:
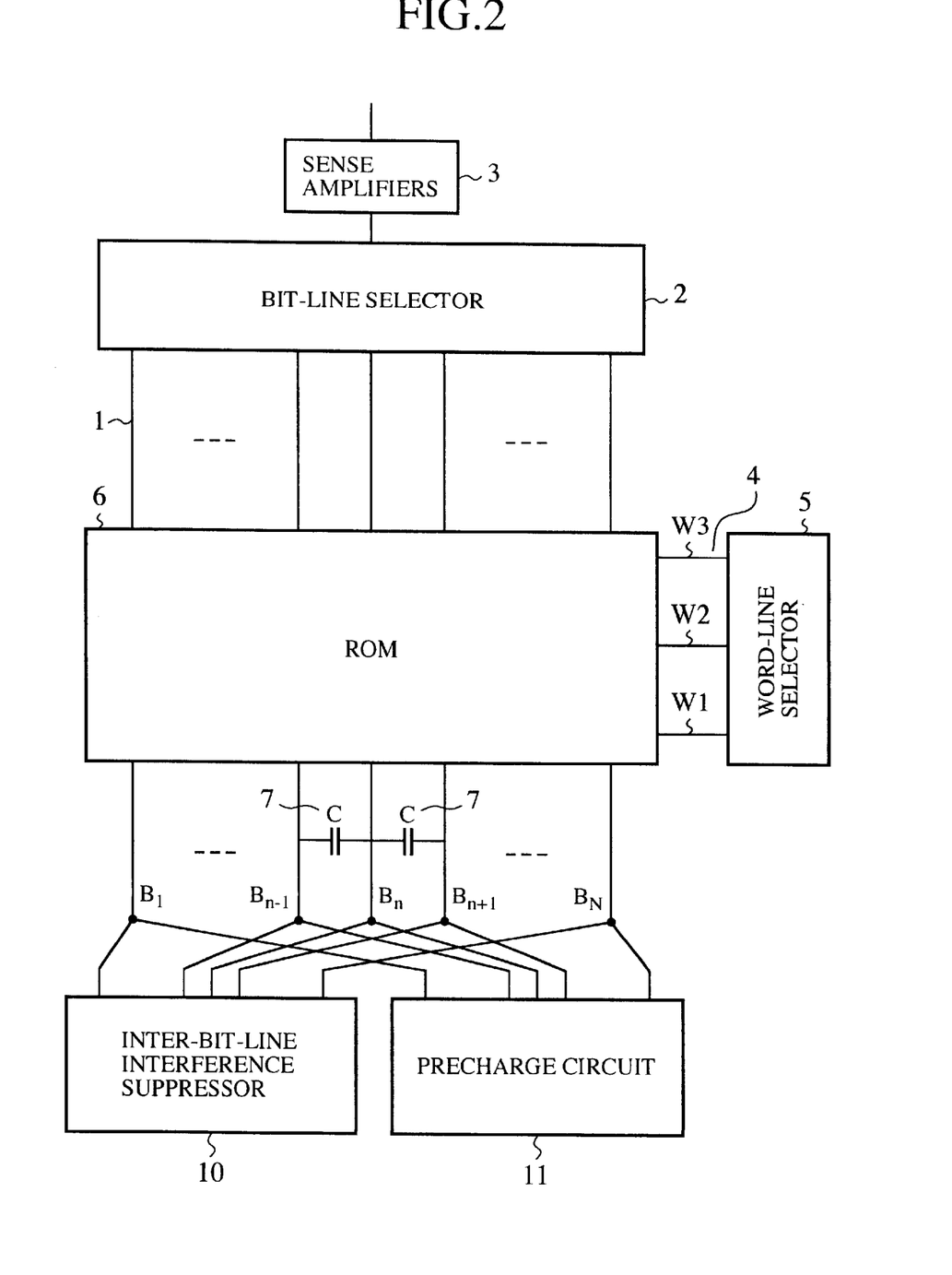
FIG. 2 is a block diagram showing a configuration of an embodiment 2 of the semiconductor memory in accordance with the present invention.

Although the foregoing embodiment 1 installs the test ROM 8 as the inter-bit-line interference test circuit, the present embodiment 2 configures the inter-bit-line interference test circuit by utilizing the actually used ROM 6.

FIG. 2 is a block diagram showing the embodiment 2 of the semiconductor memory in accordance with the present invention. In this figure, the reference numeral 11 designates a precharge circuit for precharging all the bit lines 1, . . . , 1 simultaneously when estimating and testing the function of the inter-bit-line interference suppressor 10. In FIG. 2, the same reference numerals designate the same or like components to those of FIG. 1, and the description thereof is omitted here.

Next, the operation of the present embodiment 2 will be described.

As in the foregoing embodiment 1, since the present invention relates to a semiconductor memory capable of facilitating estimation and test on the function of the inter-bit-line interference suppressor 10 for suppressing the interference between the bit lines 1 and 1, the test operation will be described here.

First, when the test program is input to the microcomputer embedding the embodiment 2 of the semiconductor memory, the precharge circuit 11 precharges all the bit lines 1, . . . , 1 to the high potential state (to a potential higher than the threshold value of the sense amplifiers 3).

Subsequently, a memory transistor corresponding to a given address in the ROM 6 is selected as a target of the test, and the data it stores is read. In the course of this, the function of the inter-bit-line interference suppressor 10 is easily estimated and tested by monitoring the potential change of the bit lines 1 and 1 adjacent to the memory transistor to be tested.

For example, assume that the memory transistor placed at the intersection point of the bit line $B_n$ and the word line W2 is selected as the test target.

Consider the case where the data stored in the memory transistors adjacent to the test target, that is, the data stored in the memory transistors placed at the intersection point of the bit line $B_{n-1}$ and the word line W2 and that of the bit line $B_{n+1}$ and the word line W2 are at the L level (that is, the drains of the memory transistors placed at the intersection points of the bit lines $B_{n-1}$ and $B_{n+1}$ and the word line W2 are connected to the bit lines $B_{n-1}$ and $B_{n+1}$, respectively).

If the inter-bit-line interference suppressor 10 connected to the bit lines $B_{n-1}$ and $B_{n+1}$ is inactive, the H level potentials of the bit lines produced by the precharge circuit 11 are maintained.

When the word-line selector 5 asserts the word line W2 to read the data stored in the memory transistor to be tested, the gates of the adjacent memory transistors are turned on so that the H level potentials of the bit lines produced by the precharge circuit 11 will drop toward the ground level.

In this case, if the data stored in the memory transistor to be tested is the H level (that is, if the drain of the memory transistor placed at the intersection point of the bit line $B_n$ and the word line W2 is not connected to the bit line $B_n$, or if its gate is always kept in the OFF state), the memory transistor to be tested undergoes the electrical interference from the bit lines $B_{n-1}$ and $B_{n+1}$ because of their potential changes from the H level toward the ground level as in the foregoing embodiment 1.

Accordingly, by monitoring the potential changes of the bit lines 1 and 1 adjacent to the memory transistor to be tested when selecting the memory transistor to be tested after the precharge circuit 11 precharges all the bit lines 1, . . . , 1 to the high potential state, a decision can be made that the inter-bit-line interference suppressor 10 does not operate normally if the potential is maintained at the H level, and that the inter-bit-line interference suppressor 10 operates normally when the potential of the bit lines drops from the H level to the ground level.

If the data stored in the memory transistor to be tested is the L level, or if the data stored in the memory transistors adjacent to the memory transistor to be tested is the H level, the electrical interference does not occur regardless of the function of the inter-bit-line interference suppressor 10. In this case, since the electrical interference between the bit lines 1 and 1 does not take place in the actual operation, the function of the inter-bit-line interference suppressor 10 does not suffer any failure.

As described above, the present embodiment 2 places all the bit lines 1, . . . , 1 of the ROM 6 at the high potential state by simultaneously precharging them, selects from the ROM 6 the memory transistor between the bit lines which are brought into the high potential state as the memory cell to be tested, and tests whether the suppression function of the inter-bit-line interference suppressor 10 is normal or not against the electrical interference from the adjacent bit lines. Accordingly, it becomes unnecessary to search for the address order of the memory transistors t hat can generate the inter-bit-line interference by analyzing the data stored in the ROM 6. As a result, the present embodiment 2 can facilitate the test on the function of the inter-bit-line interference suppressor 10. In addition, utilizing the actually used ROM 6 makes it possible to test the function of the inter-bit-line interference suppressor 10 in the condition close to that of the actual operation, improving the reliability of the test.

Incidentally, in the present embodiment 2, the precharge circuit 11 can precharge all the bit lines 1, . . . , 1 beyond the potential in actual operation. Thus, the potential changes of the bit lines 1 and 1 adjacent to the memory transistor to be tested increase, thereby producing the interference between the bit lines 1 and 1 more easily than in the actual operation. As a result, it is possible to carry out more rigorous estimation and test on the function of the inter-bit-line interference suppressor 10 than in the actual operating condition, thereby improving the reliability of the function of the inter-bit-line interference suppressor 10.

Although the precharge circuit 11 precharges all the bit lines 1, . . . , 1 in the present embodiment 2, it can selectively precharges the bit lines 1 and 1 adjacent to the memory transistor to be tested, which can reduce power consumption required for the test as compared with the test that precharges all the bit lines 1, . . . , 1 simultaneously.

Furthermore, when selectively precharging the bit lines 1 and 1 adjacent to the memory transistor to be tested, the reliability of the function of the inter-bit-line interference suppressor 10 can be improved by precharging them to a potential higher than that of the actual operation.

Embodiment 3

Figure 3:
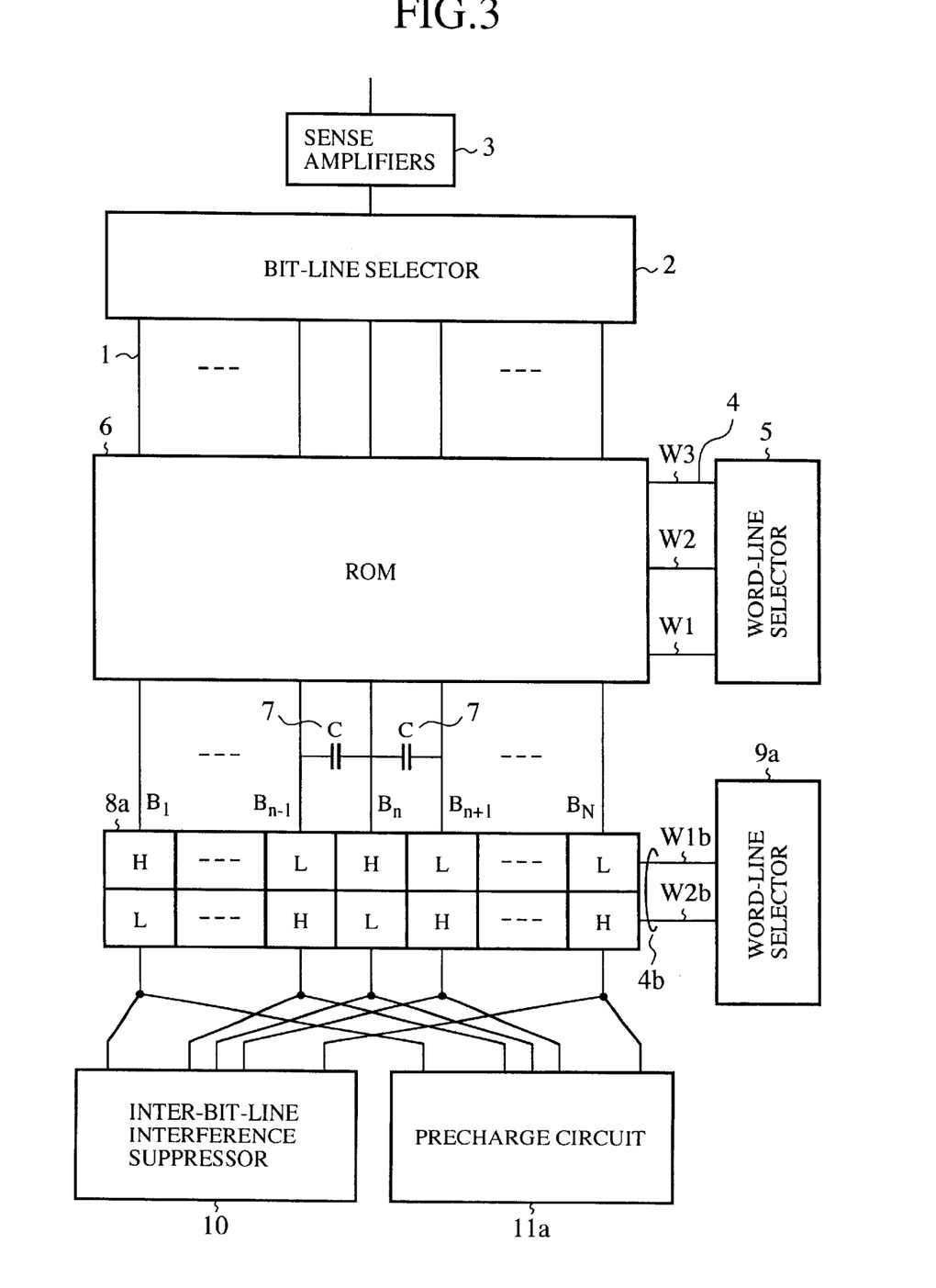
FIG. 3 is a block diagram showing a configuration of an embodiment 3 of the semiconductor memory in accordance with the present invention.

The present embodiment 3 applies the test ROM 8 of the foregoing embodiment 1 to the semiconductor memory of the foregoing embodiment 2.

FIG. 3 is a block diagram showing the embodiment 3 of the semiconductor memory in accordance with the present invention. In this figure, the reference numeral 4b designates word lines for selecting some of the memory transistors in a test ROM 8a. In the example of FIG. 3, word lines W1b and W2b are connected to a word-line selector 9a. The reference numeral 8a designates a test ROM including a plurality of memory transistors placed at intersection points of the bit lines 1, . . . , 1 and the two word lines 4b which intersect perpendicularly in a matrix fashion, in which adjacent memory transistors store bit values opposite to each other as in the foregoing embodiment 1. The dimension of the test ROM 8a is two word lines in height and the same as the ROM 6 in width. The reference numeral 9a designates the word-line selector for decoding an address specified by the test program and for asserting one of the word lines 4b corresponding to the address when testing the function of the inter-bit-line interference suppressor 10 for suppressing the interference between the bit lines 1 and 1. The reference numeral 11a designates a precharge circuit for precharging all the bit lines 1, . . . , 1 simultaneously when carrying out the estimation and test on the function of the inter-bit-line interference suppressor 10. In FIG. 3, the same reference numerals designate the same or like components to those of FIG. 1, and the description thereof is omitted here.

Next, the operation of the present embodiment 3 will be described.

As in the foregoing embodiment 1, since the present invention relates to a semiconductor memory capable of facilitating estimation and test on the function of the inter-bit-line interference suppressor 10 for suppressing the interference between the bit lines 1 and 1, only the test operation will be described here.

First, when the test program is input to the microcomputer embedding the embodiment 3 of the semiconductor memory, the precharge circuit 11a precharges all the bit lines 1, . . . , 1 to the high potential state (to a potential higher than the threshold value of the sense amplifiers 3).

Subsequently, the word-line selector 5 asserts one of the word lines 4 of the ROM 6 to select the memory transistor to be tested, and to read the data stored in the memory transistor. When reading the data, the word-line selector 9a asserts one of the word lines W1b and W2b to drop the potential of the bit lines adjacent to the memory transistor to be tested.

In the course of this, the function of the inter-bit-line interference suppressor 10 can be easily estimated and tested by monitoring the potential changes of the bit lines 1 and 1 adjacent to the memory transistor to be tested.

For example, when the memory transistor placed at the intersection point of the bit line $B_n$ and the word line W2 is selected as the test target, the word-line selector 9a asserts the word line W1b. Thus, the gates are turned on of the memory transistors that store the L level value and are placed at the intersection points of the bit lines $B_{n-1}$ and $B_{n+1}$ and the word line W1b. As a result, the potentials of the bit lines $B_{n-1}$ and $B_{n+1}$ drop from the H level to the ground level.

In this case, if the inter-bit-line interference suppressor 10 connected to the bit lines $B_{n-1}$ and $B_{n+1}$ is in active, the reading of the data stored in the memory transistor to be tested can undergo the electrical interference from the bit lines $B_{n-1}$ and In contrast, when the inter-bit-line interference suppressor 10 connected to the bit lines $B_{n-1}$ and $B_{n+1}$ is in operation, the potentials of the bit lines $B_{n-1}$ and $B_{n+1}$ are released when the word-line selector 9a asserts the word line W1b, thereby preventing the electrical interference from the bit lines $B_{n-1}$ and $B_{n+1}$.

Thus, the potential changes of the bit lines 1 and 1 adjacent to the memory transistor to be tested are monitored when the memory transistor to be tested is selected after the precharge circuit 11a precharges all the bit lines 1, . . . , 1 to the high potential state. In the course of this, a decision can be made as to whether the inter-bit-line interference suppressor 10 operates normally or not by checking whether the potentials of the bit lines $B_{n-1}$ and $B_{n+1}$, are released or not by the inter-bit-line interference suppressor 10 that brings the potentials of the adjacent bit lines to potentials lower than the H level when the word line selector 9a asserts the word line W1b.

As described above, according to the present embodiment 3, the precharge circuit 11a places all the bit lines 1, . . . , 1 at the high potential state by simultaneously precharging them; the word line selector 9a asserts one of the word lines 4b of the test ROM 8a to release the potentials of the bit lines 1 and 1 placed at the high potential state; the word line selector 5 selects the memory transistor of the ROM 6 between the bit lines 1 and 1 with their potentials being varied as the memory transistor to be tested; and the suppression function of the inter-bit-line interference suppressor 10 is tested whether it operates normally against the electrical interference from the bit lines 1 and 1 adjacent to the memory transistor to be tested. Thus, the present embodiment 3 can test the function of the inter-bit-line interference suppressor 10 under the condition that can produce the inter-bit-line interference regardless of the data stored in the ROM 6. In addition, utilizing the actually used ROM 6 makes it possible for the function of the inter-bit-line interference suppressor 10 to be tested in the condition close to that of the actual operation, improving the reliability of the test.

Although the precharge circuit 11a precharges all the bit lines 1, . . . , 1 in the present embodiment 3, it can selectively precharges the bit lines 1 and 1 adjacent to the memory transistor to be tested, which can reduce power consumption required for the test as compared with the test that precharges all the bit lines 1, . . . , 1.

Furthermore, when selectively precharging the bit lines 1 and 1 adjacent to the memory transistor to be tested, the precharge circuit 11a can precharge them beyond the potential used in the actual operation. This will make the estimation and test on the function of the inter-bit-line interference suppressor 10 more rigorous, improving the reliability of the function of the inter-bit-line interference suppressor 10.

Furthermore, in the foregoing embodiments 1–3, the estimation and test on the function of the inter-bit-line interference suppressor 10 can be carried out by placing the potentials of the word lines 4, 4a and 4b of the ROM 6, and the test ROMs 8 and 8a at a potential higher than the potential Vcc in the actual operation to assert them. The higher potential can increase the drain-source current of the memory transistors, which can accelerate the potential changes of bit lines 1 and 1 adjacent to the tested memory transistor, and hence can produce the interference between the bit lines 1 and 1 more easily than in the actual operation. As a result, it serves to carry out more rigorous estimation and test on the function of the inter-bit-line interference suppressor 10 than in actual operating condition, improving the reliability of the function of the inter-bit-line interference suppressor 10.

Moreover, the foregoing embodiments 1–3 can comprise a source potential modifying means for placing the source potential of the memory transistors at a potential equal to or less than zero volt.

Figure 4:
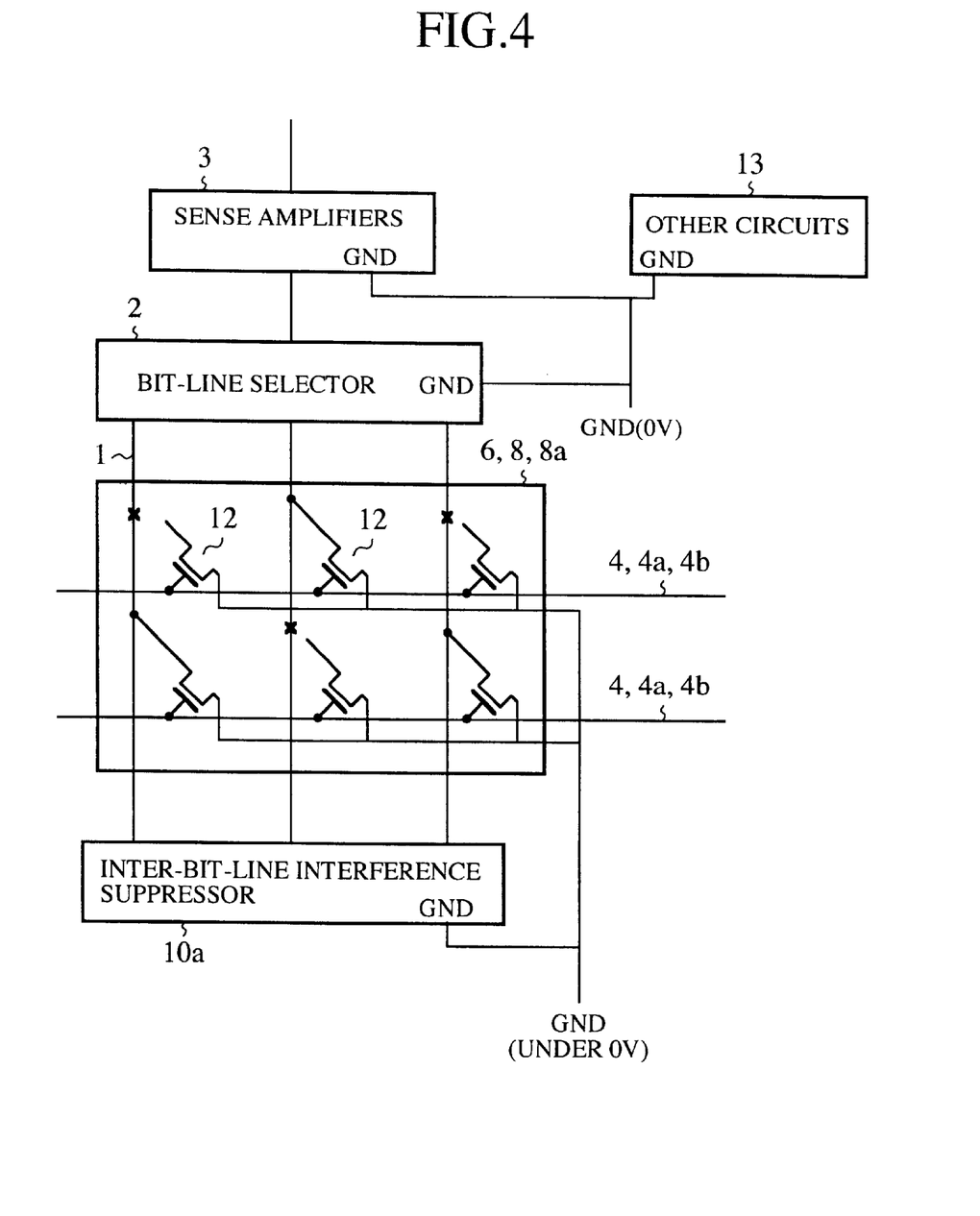
FIG. 4 is a block diagram showing a configuration of a source potential modifying means.

FIG. 4 is a block diagram showing a configuration of the source potential modifying means. In this figure, the reference numeral 10a designates an inter-bit-line interference suppressor using the potential equal to or less than zero volt as the ground potential. Before the data stored in the memory transistor to be tested is read, the inter-bit-line interference suppressor 10a reduces the potentials of the bit lines land 1 adjacent to the memory transistor to be tested from the precharged potential to the potential equal to or less than zero volt, thereby releasing the potentials that can cause the inter-bit-line interference. Each reference numeral 12 designates a memory transistor (memory cell) which constitutes the ROM 6 or the test ROM 8 or 8a, and the source of which is connected to the power supply with the potential equal to or less than zero volt. The reference numeral 13 designates circuits other than the semiconductor memory in accordance with the present invention, which circuits are mounted on the microcomputer, and share the ground potential of zero volt with the bit-line selector 2 and sense amplifiers 3. In FIG. 4, the same reference numerals designate the same or like components to those of FIGS. 1–3, and the description thereof is omitted here.

Next, the outline of the semiconductor memory will be described.

The estimation and test on the function of the inter-bit-line interference suppressor 10a can be carried out by placing the potential of the sources of the memory transistors 12 constituting the ROM 6 or the test ROM 8 or 8a in the foregoing embodiments 1–3 at the potential equal to or less than zero volt. This serves to increase the drain-source current of the memory transistors, causing the interference between the bit lines 1 and 1 to occur more easily than in the actual operation. As a result, it can carry out more rigorous estimation and test on the function of the inter-bit-line interference suppressor 10a than in actual operating condition, thereby improving the reliability of the function of the inter-bit-line interference suppressor 10a.

What is claimed is:

1. A semiconductor memory comprising:
a memory cell block including a plurality of memory cells placed at individual intersection points of a plurality of word lines and a plurality of bit lines that are arranged in a matrix fashion;
an inter-bit-line interference suppression circuit connected to the plurality of bit lines, for releasing potentials of bit lines adjacent to a memory cell whose data is to be read among the memory cells of said memory cell block, thereby suppressing electrical interference between the bit lines;
means for precharging, before reading data stored in a memory cell to be tested, at least bit lines adjacent to a bit line corresponding to the memory cell to be tested among the plurality of bit lines;
test memory cell selector for asserting a word line of the memory cell to be tested that is connected to a bit line between, the bit lines precharged by said means for precharging; and
a decision circuit for deciding as to whether said inter-bit-line interference suppression circuit operates normally or not in response to the data stored in the memory cell to be tested or to potential changes of the bit lines precharged.

2. The semiconductor memory according claim 1, further comprising a test memory cell block including a plurality of memory cells placed at individual intersection points of the plurality of bit lines and at least two word lines that are arranged in a matrix fashion, in which the memory cells adjacent to each other store bit values opposite to each other,
wherein said means for precharging consists of a bit line selector, and
said test memory cell selector produces the potential changes of the precharged bit lines by asserting one of the word lines of said test memory cell block, and selects a memory cell that is connected to a bit line between the bit lines with their potentials changed from said test memory cell block as the memory cell to be tested.

3. The semiconductor memory according to claim 2, wherein at least one of a gate width and a gate length of the memory cells of said test memory cell block is greater than those of the memory cells constituting said memory cell block.

4. The semiconductor memory according to claim 2, wherein said test memory cell selector asserts the word line of said test memory cell block by a potential higher than a potential used in an actual operation.

5. The semiconductor memory according to claim 1, wherein said means for precharging consists of a precharge circuit for precharging all the bit lines simultaneously, and said test memory cell selector selects a memory cell that is connected to a bit line between the bit lines precharged by said precharge circuit from said memory cell block as the memory cell to be tested.

6. The semiconductor memory according to claim 1, further comprising a test memory cell block including a plurality of memory cells placed at individual intersection points of the plurality of bit lines and at least two word lines that are arranged in a matrix fashion, in which the memory cells adjacent to each other store bit values opposite to each other,
wherein said means for precharging consists of a precharge circuit for precharging all the bit lines simultaneously, and
said test memory cell selector produces the potential changes of the precharged bit lines by asserting one of the word lines of said test memory cell block, and selects a memory cell that is connected to a bit line between the bit lines with their potentials changed from said test memory cell block as the memory cell to be tested.

7. The semiconductor memory according to claim 1, wherein said means for precharging precharges the bit lines up to a potential higher than a potential used in an actual operation.

8. The semiconductor memory according to claim 1, wherein said test memory cell selector asserts the word line of said memory cell block by a potential higher than a potential used in an actual operation.

9. The semiconductor memory according to claim 1, further comprising source potential modifying means for bringing a source potential of the transistors constituting said memory cells to a potential equal to or less than a ground level.

10. A test method of a semiconductor memory including a memory cell block having a plurality of memory cells placed at individual intersection points of a plurality of word lines and a plurality of bit lines that are arranged in a matrix fashion, and an inter-bit-line interference suppression circuit connected to the plurality of bit lines, for releasing potentials of bit lines adjacent to a memory cell whose data is to be read among the memory cells of said memory cell block, thereby suppressing electrical interference between the bit lines, said test method of a semiconductor memory comprising the steps of:
precharging at least bit lines adjacent to a bit line corresponding to a memory cell to be tested among the plurality of bit lines;
asserting a word line of the memory cell to be tested that is connected to a bit line between the bit lines precharged; and
deciding, in response to the data stored in the memory cell to be tested or to potential changes of the bit lines precharged, as to whether a suppression function of said inter-bit-line interference suppression circuit operates normally or not against electrical interference from the bit lines adjacent to the memory cell to be tested.

11. The test method of the semiconductor memory according to claim 10, wherein said semiconductor memory further comprises a test memory cell block including a plurality of memory cells placed at individual intersection points of the plurality of bit lines and at least two word lines that are arranged in a matrix fashion, in which the memory cells adjacent to each other store bit values opposite to each other, and wherein the step of asserting produces the potential changes of the precharged bit lines by asserting one of the word lines of said test memory cell block, and selects a memory cell connected to a bit line between the bit lines with their potentials changed from said test memory cell block as the memory cell to be tested.

12. The test method of the semiconductor memory according to claim 10, wherein the step of precharging precharges all the bit lines simultaneously, and the step of asserting selects a memory cell that is connected to a bit line between the precharged bit lines from said memory cell block as the memory cell to be tested.

13. The test method of the semiconductor memory according to claim 10, wherein said semiconductor memory further comprises a test memory cell block including a plurality of memory cells placed at individual intersection points of the plurality of bit lines and at least two word lines that are arranged in a matrix fashion, in which the memory cells adjacent to each other store bit values opposite to each other, and wherein the step of precharging precharges all the bit lines simultaneously, and the step of asserting produces the potential changes of the precharged bit lines by asserting one of the word lines of said test memory cell block, and selects a memory cell connected to a bit line between the bit lines with their potentials changed from said test memory cell block as the memory cell to be tested.

* * * * *